ENCAPSULATION AND CONNECTION STRUCTURE FOR HIGH POWER AND HIGH FREQUENCY SEMICONDUCTOR DEVICES

Filed June 14, 1966

INVENTOR.
GEORGE J. GILBERT
BY M. Y. Epstein
Attorney 3,479,570
Patented Nov. 18, 1969

3,479,570

ENCAPSULATION AND CONNECTION STRUCTURE FOR HIGH POWER AND HIGH FREQUENCY SEMICONDUCTOR DEVICES

George J. Gilbert, Whitehouse Station, N.J., assignor to RCA Corporation, a corporation of Delaware Filed June 14, 1966, Ser. No. 557,499
Int. Cl. H01l 3/00, 5/00
U.S. Cl. 317—234 7 Claims

ABSTRACT OF THE DISCLOSURE

A transistor pellet is mounted on a support member or substrate together with a plurality of electrically conductive terminal members or blocks. Means are provided for electrically connecting different portions of the pellet to different ones of the blocks. The pellet, a portion of the substrate on which the pellet is mounted, the connecting means, and the blocks, with the exception of substantially no more than a surface of each of the terminal members, are encapsulated in an encapsulating material.

This invention relates to semiconductor devices which have particular utility in, but are not limited to, applications involving high frequency radio waves, and high output power.

An object of this invention is to provide novel and improved semiconductor devices.

Another object of this invention is to provide novel and improved semiconductor devices of low cost, said devices having low lead or terminal inductance, and being particularly suitable for use in high frequency applications.

For achieving these objects, a known type semiconductor pellet, e.g. a transistor pellet, is mounted on a support member or substrate together with a plurality of electrically conductive terminal members or blocks. Means are provided for electrically connecting different portions of the pellet to different ones of the blocks. The pellet, a portion of the substrate on which the pellet is mounted, the connecting means, and the blocks, with the exception of substantially no more than a surface of each of the terminal members, are encapsulated in an encapsulating material. In the use of the device, electrical connections are made to the exposed block surfaces.

Figure 1:
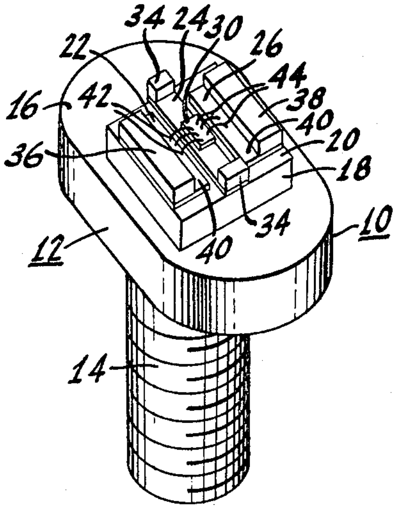
FIG. 1 is a view in perspective of a device mount.

With reference to FIG. 1, a semiconductor device mount 10 is shown comprising a support member 12 including a threaded stud 14 and an enlarged header 16. In this embodiment, the semiconductor device is a power-output transistor. To this end, the support member 12 is made of a high heat conductive material, such as nickel plated copper.

Mounted on the header 16 is a substrate 18 of a high heat conducting insulating material, such as an alumina or beryllia ceramic, the latter being preferred. The bottom surface of the substrate 18 is metallized, as by known molybdenum metallizing processes, for example, and the substrate 18 is bonded to the header 16 by means of, for example, a copper braze. The upper surface 20 of the substrate is provided with three parallel, rectangular metallized areas 22, 24, and 26. The areas 22, 24 and 26 can be provided, for example, by known molybdenum metallizing processes. Mounted on the middle area 24, in the center thereof, is a pellet 30 of a semiconductor material, such as silicon. The pellet 30 has therein a pattern of different conductivity-type regions providing, e.g., NPN type transistor characteristics. The pellet 30 is of known type, hence details thereof are not provided. The bottom surface of the pellet 30 is metallized, as with gold by known means, and is bonded to the metallized area 24 by, for example, a gold silicon eutectic.

Also mounted on the metallized area 24 at either end thereof, are a pair of electrically conductive terminal members in the form of blocks 34. The "block" is meant a relatively massive member, whether solid or not, having relatively large dimensions in comparison with the lead or terminal members usually used in semiconductor devices. In this embodiment, the blocks are nickel plated copper. Other metals such as nickel and Kovar, or the like, can be used. The blocks 34 are electrically connected to and bonded to the metallized area 24 by, for example, a copper braze. Alternately, the blocks 34 can be integral portions of the insulating material substrate 18, the surface of the blocks being heavily metallized to make the blocks conductive.

Mounted on the metallized areas 22 and 26 are elongated rectangular terminal members in the form of blocks 36 and 38, respectively. As shown, the blocks 36 and 38 do not completely cover their respective metallized areas 22 and 26, but leave portions 40 thereof exposed. The blocks 36 and 38 can be of any of the materials enumerated in connection with the blocks 34 and are likewise bonded to and electrically connected to their respective metallized areas 22 and 26.

Different portions of the pellet 30 are electrically connected to each block 36 and 38 by means of wires 42 and 44. Each of the wires 42 is bonded to one electrode of the pellet 30 and to the exposed portion 40 of the metallized area 22. Each of the wires 44 is bonded to another electrode of the pellet 30 and to the exposed portion 40 of the metallized area 26. Known wire bonding means, such as ultrasonic bonding can be used. The third electrode of the NPN type pellet of this embodiment extends to the bottom surface of the pellet 30 and is electrically connected to the metallized area 24.

Figure 2:
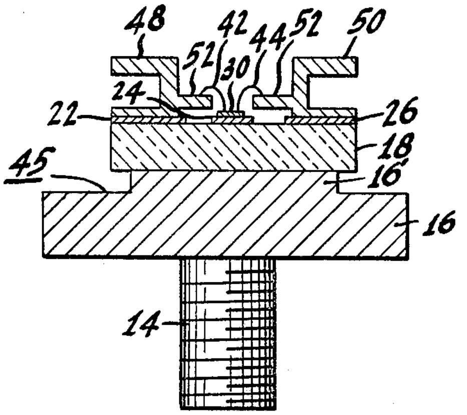
FIG. 2 is a view in section of a portion of another embodiment of a device mount.

In another embodiment, shown in FIG. 2, a semiconductor device mount 45 is illustrated which differs from the device 10 in that a pair of terminal members in the form of blocks 48 and 50 are provided each having a step or ridge 52 extending towards the pellet 30 in spaced relation with the substrate 18. An advantage of this construction is that the connector wires 42 and 44, which are bonded directly to the ridges 52, can be exceptionally short. This, as known, is desirable for reasons of low device inductance. The ridges 52 are spaced above the substrate 18 to permit small spacing between the ridges and the pellet 30 without danger of shorting of the blocks 48 and 50 against the metallized area 24 under the pellet 30.

In this embodiment, the blocks 48 and 50 are not solid, but have, in cross section, a channeled or channel iron shape, or the like. An advantage of this is that the blocks are less rigid, and more readily match the expansion characteristics of the ceramic substrate 18. This reduces the danger of cracking of the substrate.

The header 16 is provided with a pedestal 16' on which the substrate 18 is mounted. As shown, the sides of the substrate 18 overhang the pedestal 16'. An advantage of the overhang is that it provides a firm anchoring surface for the encapsulating material in which the device is subsequently encapsulated. The channels in the blocks 48 and 50 likewise serve to anchor the encapsulating material to the mount.

Figure 3:
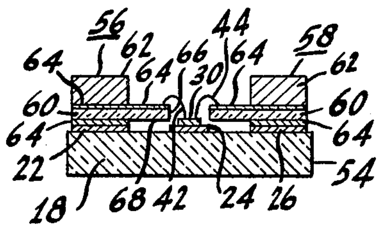
FIG. 3 is a view in section of a portion of still another embodiment of a mount device.

In a further embodiment, shown in FIG. 3, a mount 54 is shown including a pair of terminal members in the form of blocks 56 and 58 each comprising a lower member 60 of an insulating material, such as alumina ceramic, and an upper metallic member 62 of nickel plated copper, or the like. Portions of the surface of the insulating member 60 are provided with metallized layers 64, such as molybdenum, and these surface portions are brazed, as with a copper braze, to the metallized areas 22 and 26 on the substrate 18, and to the metallic members 62. The narrow sides 66 and portions 68 of the bottom surface of the ceramic members 60 are not metallized, whereby the ceramic members 60 can extend extremely close to the pellet 30, and even engage the pellet 30 and the metallized area 24 thereunder, without danger of shorting the blocks 56 and 58. The connector wires 42 and 44 can thus be extremely short.

In another embodiment, not shown, the insulating material substrate 18 comprises two separate members disposed one each under each of the metallized areas 22 and 26, and the pellet 30 is bonded directly to the header 16. The support member 12 thus serves as one terminal for the device, and the middle metallized area 24 and the blocks 34 mounted thereon are omitted.

In a further embodiment, not illustrated, the support member 12 is omitted, and the substrate 18 either serves as a portion of the enclosure of the device, or is wholly encapsulated within the device enclosure.

Figure 4:
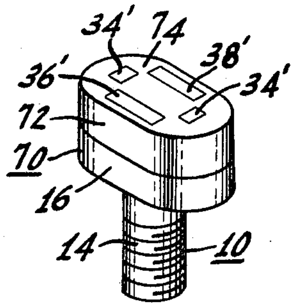
FIG. 4 is a view in perspective of an encapsulated mount.

With reference to FIG. 4, an encapsulated device 70 is shown. The enclosure 72 for the device 70 is a known silicone material, such as Dow Corning 306, which is molded onto the mount 10 in known manner. The enclosure 72 covers the entire upper surface of the header 16, and completely encapsulates the exposed portions of the substrate 18, the pellet 30, the connecting wires 42 and 44, and substantially the entire surface of the blocks 34, 36, and 38 with the exception of the upper surfaces 34', 36', and 38' thereof, respectively. In this embodiment, the block surfaces 34', 36', and 38' are substantially flush or coplanar with the upper surface 74 of the enclosure 72.

To complete the device 70, solder material is provided on each block surface 34', 36', and 38'. Although not shown, the presence of the solder raises the block surfaces 34', 36', and 38' above the surface 74 of the enclosure 72, whereby positive engagement of the blocks with suitable connectors of a socket or chassis or the like can be obtained.

In the use of the device 70, the threaded stud 14 is screwed into a suitable receptacle member in a chassis, and connectors are soldered to the surfaces of the blocks 34, 36, and 38, the blocks 34, 36, and 38 serving as the device terminals.

Advantages of the herein described devices include the great simplicity of construction and fabrication thereof, and low cost. Additionally, and of great importance for devices to be used in high frequency applications, the inductance of the terminals of the herein described devices can be made extremely small. By providing relatively large area exposed terminal member surfaces, external connections can be bonded, as by soldering, directly onto these surfaces, whereby the device terminals can terminate substantially flush or coplanar with the device enclosure. The shorter the device terminals, that is, the shorter the length of the electrical paths between the different pellet portions and the block surfaces, the smaller is the terminal inductance, as known. Additionally, the relatively large cross sectional area of the greater length of the device terminals also contributes to low terminal inductance. The inductance of the connector wires 42 and 44 is minimized by using a plurality of wires, and by making these wires as short as possible. In another embodiment, not shown, strips of thin metal foil are used to connect the pellets to the blocks to further reduce the terminal inductance. The metal foil can be provided, for example, by plating the pellet surface with a metal and peeling part of the plating from the pellet surface.

In one semiconductor device of the type illustrated in FIG. 1, for example, six wires are used between the pellet 30 and each block 36 and 38, the wires being of 1 mil diameter, and having a length of about 25 mils. The pellet 30 is 30 mils long, 75 mils wide, and 5 mils thick. The conductive blocks 36 and 38 have a length of 150 mils, a width of 60 mils, and a thickness of 60 mils. The blocks 36 and 38 are spaced 40 mils from their respective near edge of the pellet 30. The blocks 34 have a length of 60 mils, a width of 60 mils, and a thickness of 60 mils. The substrate 18 is 320 mils long, 250 mils wide, and 60 mils thick, and the header 16 is 450 mils long, 330 mils wide, and 100 mils thick. The dimensions of the completed device, excluding the stud 14, are 330 mils wide, 450 mils long, and 220 mils thick. The device has a power output capacity of 70 watts, and has a terminal inductance of 0.2 nanohenry.

What is claimed is:

1. A semiconductor device comprising:
a substrate of electrically insulating material having spaced electrically conducting areas thereon,
a semiconductor pellet mounted on one of said conductive areas,
an electrically conducting block mounted on another of said conductive areas in electrical isolation from said one area,
means for electrically connecting a portion of said pellet to said block, and
a solid enclosure encapsulating all of said substrate, said pellet, and said connecting means, and substantially all of said block with the exception of substantially no more than an exposed surface of said block.

2. A semiconductor device as in claim 1 including an electrically conductive support member, said insulating substrate being mounted on said support member, and said enclosure encapsulating portions of said support member.

3. A semiconductor device as in claim 2 wherein said support member includes a pedestal, said substrate is mounted on said pedestal in overhang relation therewith, and said solid enclosure is disposed in surrounding relation with said pedestal and the overhanging portion of said substrate, thereby providing anchoring of said enclosure to said substrate.

4. A semiconductor device comprising:
an insulating substrate,
spaced metallized areas on said insulating member,
a semiconductor pellet mounted on a first one of said areas,
a first terminal member on said first metallized area, a second terminal member mounted on a second one of said areas, at least one of said terminal members comprising an elongated open-ended, channel-shaped member,
means for electrically connecting different portions of said pellet to different ones of said terminal members, and
a solid enclosure encapsulating portions of said substrate, all of said pellet, said areas, and said connecting means, and substantially all of said terminal members with the exception of an exposed portion of each of said members.

5. A semiconductor device as in claim 4 wherein said second terminal member leaves exposed a portion of said second metallized area, and one of said electrically connecting means is connected between a portion of said pellet and said exposed metallized area.

6. A semiconductor device as in claim 4 wherein:
said second terminal member includes an elongated, laterally extending ridge extending towards said pellet, and
one of said connecting means comprises a plurality of fine wires connected between a portion of said pellet and said extending ridge, said wires being disposed in parallel spaced relation along a portion of the length of said extending ridge.

7. A semiconductor device comprising:

a metallic header having an extending pedestal, an insulating substrate mounted on said pedestal in overhanging relation therewith, spaced metallized areas on said substrate, a semiconductor pellet on a first one of said metallized areas, a first electrode of said pellet being electrically connected to said first metallized area, a first conductive terminal mounted on said first area in spaced relation with said pellet, a second conductive terminal mounted on a second one of said metallized areas, said second terminal comprising an elongated, open-ended channel-shaped member, and including an elongated, laterally extending ridge extending in the direction of said pellet, a plurality of parallel, fine connector wires electrically connecting a second electrode of said pellet to said extending ridge along a portion of the length thereof, and an encapsulating material encapsulating said pedestal, and said substrate, including the overhanging portion of said substrate, thereby anchoring said encapsulating material to said substrate, and completely encapsulating said metallized areas, said, pellet, and said connector wires, and said encapsulating material substantially completely encapsulating said terminals with the exception of an exposed surface portion of each of said terminals.

References Cited

UNITED STATES PATENTS

| | | | |
|---|---|---|---|
| 2,898,474 | 8/1959 | Rutz | 250—211 |
| 3,171,187 | 3/1965 | Ikeda et al. | 29—25.3 |
| 3,231,797 | 1/1966 | Koch | 317—235 |
| 3,243,670 | 3/1966 | Dunster et al. | 317—234 |
| 3,274,453 | 9/1966 | Sikina | 317—234 |
| 3,283,224 | 11/1966 | Erkan | 317—234 |
| 3,310,858 | 3/1967 | Johnston | 29—25.3 |
| 3,335,336 | 8/1967 | Urushida et al. | 317—234 |
| 3,387,190 | 6/1968 | Winkler | 317—234 |

JOHN W. HUCKERT, Primary Examiner

J. R. SHEWMAKER, Assistant Examiner